US006010817A

United States Patent [19]

Van Damme et al.

[11] Patent Number: 6,010,817

[45] Date of Patent: Jan. 4, 2000

[54] HEAT SENSITIVE IMAGING ELEMENT AND A METHOD FOR PRODUCING LITHOGRAPHIC PLATES THEREWITH

[75] Inventors: Marc Van Damme, Heverlee; Joan Vermeersch, Deinze, both of Belgium

[73] Assignee: Agfa-Gevaert, N.V., Mortsel, Belgium

[21] Appl. No.: 08/762,441

[22] Filed: Dec. 9, 1996

Related U.S. Application Data

[60] Provisional application No. 60/011,640, Feb. 14, 1996.

[30] Foreign Application Priority Data

Dec. 14, 1995 [EP] European Pat. Off. .............. 95203494

[51] Int. Cl.[7] .............. G03F 7/34

[52] U.S. Cl. .............. 430/200; 430/253; 430/273.1; 430/272.1; 430/964

[58] Field of Search .............. 430/200, 253, 430/964, 273.1, 272.1

[56] References Cited

U.S. PATENT DOCUMENTS 3,770,434 11/1973 Celeste .............. 430/253
4,357,413 11/1982 Cohen et al. .............. 430/253
5,395,729 3/1995 Reardon et al. .............. 430/200

*Primary Examiner*—Richard L. Schilling
*Attorney, Agent, or Firm*—Breiner & Breiner

[57] ABSTRACT

According to the present invention there is provided a heat sensitive imaging element comprising a support having a hydrophilic surface contiguous to said hydrophilic surface of a support a hydrophobic heat sensitive composition comprising a hydrophobic polymer binder, a compound capable of converting light into heat, and a reactive compound or mixture of reactive compounds present in an amount which surpasses the absorptive capacity of the hydrophobic polymer binder for said compound or mixture of compounds, the said reactive compound or mixture of compounds being reactive under the influence of heat or under the influence of a reagent which is obtained by decomposition of a heat sensitive compound one or more thermo-adhesive layers, at least one of the thermo-adhesive layers being contiguous to the hydrophobic heat sensitive composition.

14 Claims, No Drawings

HEAT SENSITIVE IMAGING ELEMENT AND A METHOD FOR PRODUCING LITHOGRAPHIC PLATES THEREWITH

Benefit is claimed under 35 USC 119(e) from provisional application 60/011,640 filed Feb. 14, 1996.

FIELD OF THE INVENTION

The present invention relates to a heat sensitive material for making a lithographic printing plate. The present invention further relates to a method for preparing a printing plate from said heat sensitive material.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

On the other hand, EP-A 95202725.8 discloses a negative-working photosensitive imaging element comprising on a hydrophilic surface of a support in the order given (i) a hydrophobic photopolymerizable composition capable of being irradiated with actinic light through the support and/or through the front and containing at least one unsaturated compound with at least one polymerizable ethylenically unsaturated group, at least one hydrophobic thermoplastic polymer and at least one photoinitiator, and (ii) optionally a receptor layer, characterized in that said hydrophobic photopolymerizable composition comprises in the order given (i) a polymerizable layer contiguous to said hydrophilic surface and comprising at least part of said at least one unsaturated compound and (ii) a hydrophobic photosensitive layer contiguous to said polymerizable layer comprising at least part of said at least one hydrophobic thermoplastic polymer and of said at least one photoinitiator and the peeling force of said photopolymerisable composition ranges from 0.1 N/m to 12 N/m.

A particular disadvantage of photosensitive imaging elements such as described above for making a printing plate is that they have to be shielded from the light.

On the other hand, methods are known for making printing plates that are heat sensitive rather than photosensitive. For example, Research Disclosure no 33303 of January 1992 discloses a heat sensitive imaging element comprising on a support a cross-linked hydrophilic layer containing thermoplastic polymer particles and an infrared absorbing pigment such as e.g. carbon black. By imagewise exposure to an infrared laser, the thermoplastic polymer particles are imagewise coagulated thereby rendering the surface of the imaging element and these areas ink acceptant without any further development. A disadvantage of this method is that the printing plate obtained is easily damaged since the non-printing areas may become ink accepting when some pressure is applied thereto. Moreover, under critical conditions, the lithographic performance of such printing plate may be poor and accordingly such printing plate has little lithographic printing latitude.

SUMMARY OF THE INVENTION

It is an object of the present invention to provide a heat sensitive imaging element for making a lithographic printing plate having excellent printing properties in a convenient and environmental friendly way.

It is another object of the present invention to provide a method for obtaining a negative working lithographic printing plate of a high quality and in a convenient and environmental friendly way using said imaging element.

Further objects of the present invention will become clear from the description hereinafter.

According to the present invention there is provided a heat sensitive imaging element comprising a support having a hydrophilic surface contiguous to said hydrophilic surface of a support a hydrophobic heat sensitive composition comprising a hydrophobic polymer binder, a compound capable of converting light into heat, and a reactive compound or mixture of reactive compounds present in an amount which surpasses the absorptive capacity of the hydrophobic polymer binder for said compound or mixture of compounds, the said reactive compound or mixture of compounds being reactive under the influence of heat or under the influence of a reagent which is obtained by decomposition of a heat sensitive compound one or more thermo-adhesive layers, at least one of the thermo-adhesive layers being contiguous to the hydrophobic heat sensitive composition.

According to the present invention there is also provided a method for obtaining a lithographic printing plate comprising the steps of:

(a) image-wise or information-wise exposing an imaging element as described above (b) developing said exposed imaging element, said development comprising in the order given the steps of:

(i) laminating before or after said exposure the thermo-adhesive layer to a receptor layer or, when the imaging element does not comprise a pressure-adhesive layer laminating before or after said exposure the thermo-adhesive layer either to a receptor layer or to a pressure-adhesive layer and (ii) peeling away the receptor layer from the hydrophilic surface of the support thus transferring said hydrophobic photosensitive composition patternwise to the receptor layer.

DETAILED DESCRIPTION OF THE INVENTION

It has been found that lithographic printing plates of high quality can be obtained according to the method of the present invention using an imaging element as described above. More precisely it has been found that said printing plates are of high quality and are provided in a convenient way, thereby offering economical and ecological advantages.

Suitable thermo-adhesive layers (TALs) for use in the present invention have a glass transition temperature $T_g$ between 10° C. and 100° C. as measured with a 1090 THERMOANALYZER of Du Pont Co. During the lamination and delamination step a minimal thermal load should be imposed to the material in order to save energy and diminish the risk for material change or deformation. For these reasons the $T_g$ of the TAL is preferably below 60° C. The $T_g$ value of the TAL can be determined by the $T_g$ value of the polymer(s) used and/or by the addition of polymeric or low-molecular plasticizers or thermosolvents.

The adherence of the TAL to the receptor layer is also determined by the flow properties of the TAL while heating above the $T_g$. A parameter for describing this property is the melt viscosity. A TAL for use in accordance with the present invention has a melt viscosity of more than 3000 Poise measured at 120° C. with a VISCOELASTIC MELT TESTER of Rheometrics Co, Surrey, UK.

In order to induce easy film formation without unwanted sticking of the TAL to the backside of the imaging medium or to other materials a TAL is preferably used with a $T_g$ value between 20° C. and 45° C., a melt viscosity greater than 7000 Poise and an elasticity corresponding to a $(tg\ \delta)^{-1}$ value greater than 1.30 measured at 120° C. with a VISCOELASTIC MELT TESTER of Rheometrics Co, Surrey, UK. The $(tg\ \delta)^{-1}$ value is a measure for the elasticity as described in "Polymer Chemistry: the Basic Concept" by P. C. Hiemenz, 1984, edit. by M. Dekker Inc., New York.

For ecological and practical reasons the TAL is preferably coated from an aqueous medium. Therefore the polymers are preferably incorporated as latices.

Preferred latices are latices of styrene, styrene-butadiene, styrene-(meth)acrylate and n.butylacrylate-methylmethacrylate-acrylonitrile. These latices can contain other comonomers which improve the stability of the latex, such as acrylic acid, methacrylic acid and acrylamide. Other possible latices include polyvinylacetate, polyethylene-vinylacetate, polyacrylonitrile-butadiene-acrylic acid, polymethylmethacrylate-butylmethacrylate, polymethylmethacrylate-ethylacrylate, polystyrene-butylacrylate, polymethylmethacrylate-butadiene, polyester of terephtalic acid-sulphoisophtalic acid-ethyleneglycol, copolyester of terephtalic acid-sulphoisophtalic acid-hexanediol-ethyleneglycol.

Particularly suitable polymers for use in the TAL layer are the BAYSTAL polymer types, marketed by Bayer AG, Germany, which are on the basis of styrene-butadiene copolymers with a weight ratio between 40/60 and 80/20. If desired a few weight % (up to about 10%) of acrylamide and/or acrylic acid can be included. Other useful polymers are the EUDERM polymers, also from Bayer AG, which are copolymers comprising n.-butylacrylate, methylmethacrylate, acrylonitrile and small amounts of methacrylic acid.

Various additives can be present in the TAL to improve the layer formation or the layer properties, e.g. thickening agents, surfactants, levelling agents, thermal solvents and pigments.

Apart from the thermo-adhesive layer to which the receptor layer will be laminated and which must comply with the requirements described above the material can contain one or more supplementary thermo-adhesive layer(s) positioned between the upper TAL and the hydrophobic photosensitive composition e.g. to optimize the adherence to the hydrophobic heat sensitive composition in view of obtaining a better image quality after the delamination process. This (these) other TAL(s) can have a composition and/or physical properties different from those imposed to the upper TAL. This (these) layer(s) can contain one polymer or a mixture of polymers, optionally in combination with low-molecular additives like plasticizers or thermosolvents. Other ingredients which can be incorporated include waxes, fillers, polymer beads, glass beads, silica etc.

The thickness of the thermo-adhesive layer is important for the adherence during the lamination/delamination process. Preferably the thickness of said thermo-adhesive layer lies between 0.1 and 50 μm, more preferably between 0.1 and 15 μm.

The support of the imaging element according to the present invention has a hydrophilic surface and should be stable at the processing conditions.

Said support with a hydrophilic surface may be a hydrophilic metallic support, preferably a grained and anodized aluminum support. According to the present invention, an anodized aluminum support may be treated to improve the hydrophilic properties of its surface.

In another preferred embodiment, said support with a hydrophilic surface comprises a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. Nos. 3,971,660, 4,284,705, EP-A 405,016 and EP-A 450,199.

Said hardened hydrophilic layer in an imaging element used in accordance with the present invention preferably also contain substances that increase the mechanical strength and the porosity of the layers. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hardened hydrophilic layer is given a uniform rough texture consisting of microscopic hills and valleys, which serve as storage places for water in background areas.

The thickness of a hardened hydrophilic layer in a material according to this invention may vary in the range from 0.2 to 25 μm, preferably in the range from 1 to 10 μm.

The above mentioned flexible supports may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose esters such as cellulose acetate, cellulose propionate and cellulose butyrate; polyesters such as poly(ethylene terephthalate); polyvinyl acetals, polystyrene, polycarbonates; polyvinylchloride or poly-Alpha-olefins such as polyethylene or polypropylene.

One or more subbing layers may be coated between the support and the hardened hydrophilic layer for use in accordance with the present invention in order to get an improved adhesion between these two layers.

A preferred subbing layer for use in connection with the present invention is a subbing layer comprising a hydrophilic binder and silica.

As hydrophilic binder in said subbing layer usually a protein, preferably gelatin may be used. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

A preferred silica in said subbing layer is a siliciumdioxide of the anionic type. The colloidal silica preferably has a surface area of at least 100 $m^2$ per gram, more preferably a surface area of at least 300 $m^2$ per gram.

The surface area of the colloidal silica is determined according to the BET-value method described by S. Brunauer, P. H. Emmett and E. Teller, J. Amer. Chem. Soc. 60, 309–312 (1938).

The silica dispersion may also contains other substances, e.g. aluminium salts, stabilising agents,biocides etc.

Such types of silica are sold under the name KIESELSOL 100, KIESELSOL 300 and KIESELSOL 500 (KIESELSOL is a registered trade name of Farbenfabriken Bayer AG, Leverkusen, West-Germany whereby the number indicates the surface area in $m^2$ per gram).

The weight ratio of the hydrophilic binder to silica in the subbing layer is preferably less than 1. The lower limit is not very important but is preferably at least 0.2. The weight ratio of the hydrophilic binder to silica is more preferably between 0.25 and 0.5.

The coverage of said subbing layer is preferably more than 200 mg per $m^2$ but less than 750 mg per $m^2$, more preferably between 250 mg per $m^2$ and 500 mg per $m^2$.

The coating of the above defined subbing layer composition preferably proceeds from an aqueous colloidal dispersion optionally in the presence of a surface-active agent.

Suitable hydrophobic polymeric binders for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymers;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Polyacrylate and alpha-alkyl polyacrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alkohol;

(M) Polyvinyl acetals, e.g. polyvinyl butyral, polyvinyl formal;

(N) Polyformaldehydes;

(O) Polyurethanes and copolymers;

(P) Polycarbonates and copolymers;

(Q) Polystyrene and copolymers e.g. polystyrene/acrylonitrile, polystyrene/acrylonitrile/butadiene.

Preferably, the hydrophobic binders used in connection with the present invention are copolymers of styrene or vinyltoluene, more preferably copolymers of styrene and (meth)acrylates or of vinyltoluene and butadiene derivatives, most preferably copolymers of styrene and butyl methacrylate or of vinyltoluene and butadiene.

Suitable compounds capable of converting light into heat are preferably infrared absorbing components although the wavelength of absorption is not of particular importance as long as the absorption of the compound used is in the wavelength range of the light source used for imagewise exposure. Particular useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersions such as polypyrrole or polyaniline-based conductive polymer dispersions. The lithographic performance and in particular the print endurance obtained depends on the heat-sensitivity of the imaging element. In this respect it has been found that carbon black yields very good and favourable results. The amount of the compounds capable of converting light into heat into the hydrophobic heat sensitive composition is preferably between 0.01 and 2 g/$m^2$, more preferably between 0.1 and 1.5 g/$m^2$.

Suitable reactive compounds can be compounds which will react with each other under the influence of heat e.g. polyols such as di-trimethylolpropane.

Preferably said reactive compounds are compounds which can react under the influence of a reagent obtained by decomposition of a heat sensitive compound. In one embodiment of the present invention said reactive compounds are hardenable by reaction with a free radical e.g. monomers with at least one polymerizable ethylenically unsaturated group. Said monomer can be a monomer having one polymerizable ethylenically unsaturated group. Monomers containing at least two polymerizable ethylenically unsaturated groups are more preferably used. Particularly preferred are urethane type monomers, such as those of table I and those disclosed in EP-A 502562 and unsaturated esters of polyols, especially esters of polyols and an alpha-methylene carboxylic acid.

Examples of urethane type monomers are given in table I.

Preferably, said prepolymer has a numerical average molecular weight of not more than 25,000, more preferably of not more than 10,000.

In another embodiment of the present invention said reactive compound or mixture of reactive compounds is hardenable by reaction with an acid. The acid-sensitive compound can be a monomer capable of undergoing cationic polymerization which are well known to one skilled in the art. Alternatively said mixture of compounds comprises a compound with at least two hydroxyl groups and a reagent which is capable of crosslinking under the influence of an

TABLE I

1.

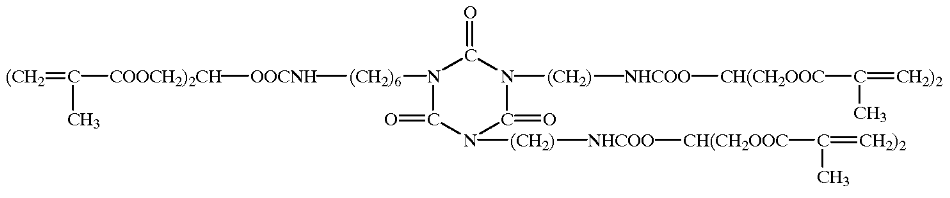

2.

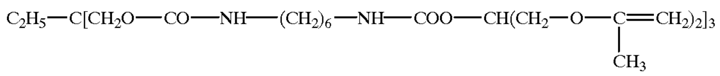

3.

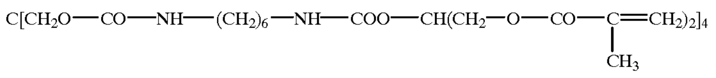

4.

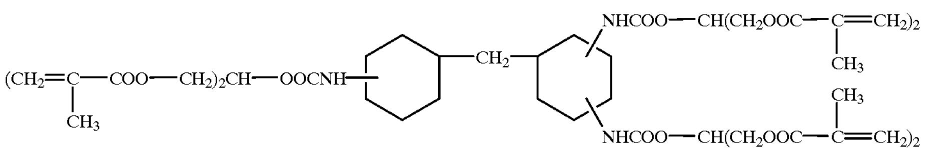

5.

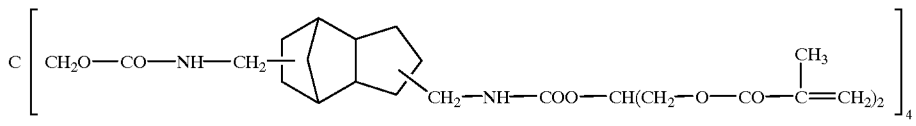

Examples of esters of a polyol and an alpha-methylene carboxylic acid are: ethylene diacrylate, glycerol tri(meth) acrylate, ethylene dimethacrylate, 1,3-propanediol di(meth) acrylate, 1,2,4-butanetriol tri(meth)acrylate, 1,4-cyclohexanediol di(meth)acrylate, 1,4-benzenediol di(meth) acrylate, pentaerythritol tetra(meth)acrylate, dipentaerythritol pentaacrylate, 1,5-pentanediol di(meth) acrylate, the bis acrylates and methacrylates of polyethylene glycols of molecular weight 200–500, and the like.

Other types of monomers suitable for use in the hydrophobic photopolymerizable composition in accordance with the present invention are e.g. the monomers disclosed in EP-A 502562, DEOS no. 4,109,239, 4,005,231, 3,643,216, 3,625,203, 3,516,257, 3,516,256 and 3,632,657, which therefor are incorporated herein by reference. Further types of monomers suitable for use in the hydrophobic photopolymerizable composition in accordance with the present invention are disclosed in EP-A 522,616. It will be clear that these monomers can be used in admixture.

In stead of or in combination with said monomers with at least one polymerizable ethylenically unsaturated group a prepolymer with at least one polymerizable ethylenically unsaturated group, preferably with two or more polymerizable ethylenically unsaturated groups can be used.

acid said compound with at least two hydroxyl groups. In another alternative said mixture of compounds comprises a compound comprising at least two latent or masked electrophilic groups that are transformed into electrophilic groups upon reaction with acid and a compound containing an aromatic moiety that is susceptible to electrophilic aromatic substitution.

Monomers capable of undergoing cationic polymerization are preferably compounds comprising at least one vinylether, propenylether or epoxy function. More preferably said compounds comprises at least two of said functions. Most preferably polyfunctional epoxy compounds are used based e.g. on the reaction product of Bisphenol A, that is 2,2-bis(4-hydroxyphenyl)propane and epichlorohydrin, for example the resins sold under the registered trademark DER by Dow Chemicals.

Compounds comprising at least two hydroxyl groups can be low molecular compounds but may also be polymers. Reagents which are capable of crosslinking under the influence of an acid said compounds with at least two hydroxyl groups are f.i. compounds comprising at least two isocyanate groups, for example the compounds sold under the registered trade name DESMODUR by Bayer, tetraalkoxymethyl glycolurils, for example the compound sold under the registered trade name CYMEL 1170 by Dyno Cyanamid and compounds represented by the following formula

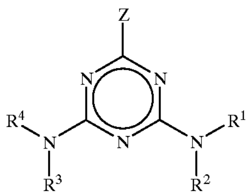

wherein Z represents —NRR' or a phenyl group, R, R' and $R^1$ to $R^4$ each independently represents a hydrogen atom, $CH_2OH$ or $CH_2OR^5$ in which $R^5$ represents an alkyl group.

Compounds comprising at least two latent or masked electrophilic groups may be aliphatic compounds comprising at least two hydroxyl functions or compounds comprising an aromatic ring substituted with at least two latent or masked electrophilic groups or compounds comprising at least two aromatic rings comprising at least one latent or masked electrophilic group. The latent or masked electrophilic group is preferably —$CH^2OR^6$, wherein $R^6$ represents a hydrogen atom or an acyl rest. Also preferably said aromatic rings are substituted phenols.

Compounds containing an aromatic moiety that are susceptible to electrophilic aromatic substitution may be low molecular weight compounds but are preferably polymers, more preferably polymers containing a phenolic moiety, most preferably polyvinyl 4-hydroxy-styreen or novolac resins.

In still another embodiment of the present invention said reactive compound or mixture of reactive compounds is hardenable by reaction with an alkali. Compounds which can undergo a hardening reaction under the influence of alkali are e.g. polyfunctional epoxy compounds. More preferably polyfunctional epoxy compounds are used based on the reaction product of Bisphenol A, that is 2,2-bis(4-hydroxyphenyl)propane and epichlorohydrin, for example the resins sold under the registered trademark DER by Dow Chemicals.

Said reactive compound or mixture of reactive compounds is used in an amount which surpasses the absorptive capacity of the hydrophobic polymer binder for said compound or mixture of compounds. This means that said compounds or at least one compound of said mixture of compounds is not completely dissolved in the hydrophobic polymer binder and that the hydrophobic heat sensitive composition comprises at least two phases so that preferably a thin layer of substantially free reactive compound is present at least at one surface of the hydrophobic heat sensitive composition more preferably at the interface between the hydrophobic heat sensitive composition and the hydrophilic surface.

The presence in an imaging element of such a layer contiguous to the hydrophilic surface of the support can be demonstrated by peeling apart the heat sensitive composition and the thermo-adhesive layer or layers from the hydrophilic surface of the support and examining said freed hydrophilic surface with ESCA or TOF-SIMS for the presence of signals, resulting from a reactive compound or mixture of compounds which is capable of reacting under the influence of heat or under the influence of a reagent obtainable by decomposition of a heat sensitive compound.

Said reactive compound preferably has a boiling point above 100° C. at normal atmospheric pressure.

As heat sensitive compound which decompose to yield radicals mostly azo and peroxide compounds are used e.g. 2,2'-azobis-isobutyronitrile and benzoylperoxide. Said compounds are preferably used in an amount ranging from 0.001 to 1 g/$m^2$, more preferably in an amount ranging from 0.01 to 0.25 g/$m^2$.

Heat sensitive acid precursors for use in connection with the present invention include sulfonium compounds, in particular benzylsulfonium compounds, as disclosed in e.g. EP 612065, EP 615233, and U.S. Pat. No. 5,326,677, inorganic nitrates such as e.g. $Mg(NO_3)_2.6H_2O$ or organic nitrates such as guanidinium nitrate, ammonium nitrate, pyridinium nitrate etc. as disclosed in EP 462763, WO 81/1755, U.S. Pat. No. 4,370,401, compounds that release a sulfonic acid such as 3-sulfolenes, e.g. 2,5-dihydrothiothiophene-1,1-dioxides as disclosed in U.S. Pat. No. 5,312,721, thermolytic compounds disclosed in GB 1.204.495, co-cristalin adducts of an amine and an volatile organic acid as disclosed in U.S. Pat. No. 3,669,747, aralkylcyanoforms as disclosed in U.S. Pat. No. 3,166,583, benzoinetosylaat, 2-nitrobenzyltosylaat and alkyl esters of organic sulfonic acids as described in EP 542008, thermo-acids disclosed in EP 159725 and DE 3515176, squaric acid generating compounds as disclosed in U.S. Pat. No. 5,278,031, acid generating compounds disclosed in U.S. Pat. No. 5,225,314 and U.S. Pat. No. 5,227,277 and RD 11511 of November 1973.

Said heat sensitive acid precursors are preferably used in an amount ranging from 0.01 to 1 g/$m^2$.

Heat sensitive alkali precursors comprises t.-butyloxycarbonyl masked amines and dicyandiamides as described by G. Eastmond et al. in Comprehensive Polymer Science, Vol 6, Pergamon Press.

To the hydrophobic heat sensitive composition there can also be added non-thermoplastic polymeric compounds to give certain desirable characteristics, e.g. to improve adhesion to said hydrophilic surface of the support used in accordance with the present invention, wear properties, chemical inertness, etc. Suitable non-thermoplastic polymeric compounds include cellulose, phenolic resins, melamine-formaldehyde resins, etc. If desired, the hydrophobic heat sensitive composition can also contain immiscible polymeric or non-polymeric organic or inorganic fillers or reinforcing agents which are essentially transparent at the wavelengths used for the exposure of the imaging element, e.g. organophilic silicas, bentonites, silica, powdered glass, colloidal carbon, as well as various types of dyes and pigments in amounts varying with the desired properties of the hydrophobic heat sensitive composition. The fillers are useful in improving the strength of the composition, reducing tack and in addition, as coloring agents.

Agents to improve the wetting and/or adjust the adhesion of the hydrophobic heat sensitive composition may be added. Suitable agents are e.g. silicons, silicon containing polymers e.g. a poly(dimethylsiloxane)-polyether copolymer, poly(dimethylsiloxane)-dioxides polyester, silicon containing surfactants, fluor containing copolymers and fluor containing surfactants etc.

Various dyes, pigments, thermographic compounds, UV-absorbers, anti-oxidants and color forming components as disclosed in EP-A 522,616 can be added to the hydrophobic heat sensitive composition to give a variety of images after the processing. These additive materials should however preferably not absorb excessive amounts of light at the exposure wavelength or inhibit the heat induced reaction.

The heat sensitive composition can also comprise additionally a reactive compound which is capable of reacting under the influence of heat or under the influence of a reagent obtainable by decomposition of a heat sensitive compound and which is present in an amount which not surpasses the absorptive capacity of the hydrophobic polymer binder for said compound.

The hydrophobic heat sensitive composition has preferably a dry thickness in the range of 0.3 to 5 $g/m^2$, more preferably in the range of 0.5 to 3.5 $/m^2$, most preferably in the range of 0.75 to 2.5 $g/m^2$.

The imaging element may be prepared by coating the layers on each other or by laminating layers or packets of layers to each other.

In a practical embodiment the imaging element is prepared by the following steps:

coating on the hydrophilic surface of the support in accordance with the present invention (i) a hydrophobic heat sensitive composition as described above and (ii) a thermo-adhesive layer.

In another practical embodiment the imaging element is prepared by laminating the above described imaging element with its thermo-adhesive layer onto a receptor layer or preferably onto a pressure-adhesive layer coated on a receptor layer.

In still another practical embodiment the imaging element is prepared by the following steps:

coating on the hydrophilic surface of a support in accordance with the present invention a hydrophobic heat sensitive composition as described above and laminating the above described imaging element with its hydrophobic photosensitive composition onto a thermo-adhesive layer coated on a receptor layer.

In still another preferred embodiment the imaging element is prepared by the following steps:

coating on the hydrophilic surface of a support in accordance with the present invention a hydrophobic heat sensitive composition as described above, laminating the above described imaging element with its hydrophobic photosensitive composition onto a thermo-adhesive layer and laminating the above described laminate with its thermo-adhesive layer onto a pressure-adhesive layer coated on a receptor layer.

Suitable pressure-adhesive layers (PALs) for use in the present invention comprise one or more pressure sensitive adhesives. Said pressure sensitive adhesives are preferably tacky elastomers e.g. block copolymers of styrene/isoprene, styrene/butadiene rubbers, butyl rubbers, polymers of isobutylene and silicones. Particularly preferred are natural rubbers and acrylate copolymers as disclosed in U.S.Pat. No. 3,857,731.

According to the present invention the pressure-adhesive layer comprising a pressure sensitive adhesive may contain a binder. Suitable binders for use in combination with the pressure sensitive adhesives are binders that are inert towards the pressure sensitive adhesives i.e. they do not chemically attack the pressure sensitive adhesives or act as a solvent for them. Examples of such binders are nitrocellulose, urethanes, gelatin, polyvinyl alcohol etc.

The amount of binder should be chosen such that the pressure sensitive adhesives are effectively anchored to the hydrophobic photosensitive composition. Preferably the amount of binder is lower than 2.5 parts by weight with respect to the pressure sensitive adhesives and more preferably lower than 0.6.

According to the present invention the pressure-adhesive layer comprising a pressure sensitive adhesive may also contain a tackyfier e.g. rosin soap or a terpene.

According to the present invention the imaging element containing a pressure-adhesive layer comprises preferably also a receptor element on top of said pressure-adhesive layer. In general said receptor element is(are) (a) transparent layer(s) contiguous to said pressure-adhesive layer e.g. a transparent organic resin layer.

The thickness of the pressure-adhesive layer is important for the adherence during the lamination/delamination process. Preferably the thickness of said pressure-adhesive layer lies between 0.1 and 50 μm, more preferably between 0.1 and 15 μm.

A receptor layer according to the invention is a layer which is capable of adhering to the underlying contiguous layer and which is overlying the thermo-adhesive layer and the pressure-adhesive layer when the latter is present. Said receptor layer is preferably stable at the processing conditions. The particular layer used is dependant on the nature of the composition of the imaging element. Suitable receptor layers include paper; cardboard; metal sheets; foils and meshes e.g. aluminum, copper, steel, bronze etc.; transparent organic resins e.g. cellulose esters such as cellulose acetate, cellulose propionate and cellulose butyrate, polyvinyl acetals, polystyrene, polycarbonate or polyvinylchloride; opaque foamed or pigmented polyester; silk; cotton and viscose rayon fabrics or screens. Preferred receptor layers are commercially available paper brands as disclosed in PCT/EP 94/02063, which therefor is incorporated herein by reference and films of polyesters such as polyethylene terephthalate or of poly-Alpha-olefins such as polyethylene or polypropylene.

A receptor element according to the invention comprises at least a receptor layer. Said receptor element may further comprises a thin additional layer. Examples of such receptor elements are supports provided with a thin metal layer e.g. polyester supports provided with a vapour deposited metal layer and most useful polyethylene coated paper. A receptor element may also comprise (an) additional layer(s) such as (a) backing layer(s).

According to the method of the present invention for obtaining an image an imaging element according to the present invention is image-wise or information-wise exposed to actinic radiation to harden the heat sensitive composition pattern-wise. The exposure is preferably an infrared exposure, more preferably by an infrared light emitting laser. Preferably used lasers are semiconductor lasers or YAG lasers e.g. Nd-YAG lasers. The laser may have an output between 40 and 7500 mW.

Said exposure can be made through the front side or the back side of the imaging element. The front side of the imaging element is that side where the thermo-adhesive layer is overlying the support and the back side of the imaging element is that side where the support is overlying the thermo-adhesive layer. It goes without saying that for an exposure through the back the support has to be transparent for the radiation used for the exposure of the imaging element where for a front side exposure any covering layer has to be transparent for said radiation. Preferably the imaging element is exposed through the front side.

The imaging element according to the present invention is a negative working imaging element. Indeed the information-wise exposure to actinic radiation hardens the hydrophobic heat sensitive composition pattern-wise in correspondence to the information-wise distribution of actinic radiation. Subsequent to the information-wise exposure the image is obtained, if said imaging element comprises as upper layer a thermo-adhesive layer, by (i) laminating before or after said exposure said imaging element with its thermo-adhesive layer to a receptor layer or more preferably to a pressure-sensitive layer coated or laminated on a receptor layer and (ii) peeling away a receptor element, comprising said receptor layer from the hydrophilic surface of the support, thereby transferring the non-hardened or insufficiently hardened parts of the hydrophobic photosensitive composition and the overlying layer(s) to the receptor element and uncovering the image comprised of the hydrophilic surface of the support and the retained hardened parts of the hydrophobic heat sensitive composition.

If said imaging element comprises as upper layers a pressure-adhesive layer laminated or coated on a receiving layer the image is obtained subsequent to the information-wise exposure, by peeling away a receptor element, comprising said receptor layer from the hydrophilic surface of the support, thereby transferring the non-hardened or insufficiently hardened parts of the hydrophobic photosensitive composition and the overlying layer(s) to the receptor element and uncovering the image comprised of the hydrophilic surface of the support and the retained hardened parts of the hydrophobic heat sensitive composition.

The force, needed to peel away the heat sensitive composition from the hydrophilic surface of a support is called the peeling force of the heat sensitive composition. Said peeling force is mainly a function of the nature of the used reactive compound or mixture of reactive compounds which is capable of reacting under the influence of heat or under the influence of a reagent obtainable by decomposition of a heat sensitive compound, polymers and their relative amounts in the heat sensitive composition and of the nature of the hydrophilic surface of the support.

Said peeling force is measured with a tensile strength tester Instron M/C 1122 serial H 1882. The heat sensitive composition, coated on the hydrophilic surface of a support is, if not comprising a laminated receptor layer of at least 63 μm thick laminated against a 6 μm thick layer consisting of Baystal P 2000, coated on a subbed polyethylene terephthalte support (having an upper subbing layer contg. gelatine and silica) of 100 μm, being then the receptor layer. The lamination is effected by means of a Codor lamipacker LPA 330 at 90° C. and 300 mm/min.

The peel test occurs at 25° C. and 50% relative humidity over a guide roller with a diameter of 13 mm and a weight of 75 g with a peel angle of 180°. The support of the imaging element is fixed so that it remains planar during the whole measurement. Said Instron is calibrated at 0 after the guide roller is put in place in a fold of the receptor layer. The receptor layer is then peeled away at a speed of 1 m/min, adjusted on said Instron for a peel of 180°. The necessary force for said peeling, as indicated by said Instron is noted; the numerical average of the result of 3 measurements is taken as the peeling force of the heat sensitive composition.

The peeling force of the heat sensitive photopolymerizable composition ranges preferably from 0.1 N/m to 12 N/m, more preferably from 0.2 N/m to 10 N/m.

When the imaging element does not comprise a pressure-adhesive layer or the receptor layer is not coated or laminated with a pressure-adhesive layer said laminating is effected by means of a heating step, preferably at a temperature between 40° C. and 180° C., more preferably at a temperature between 65° C. and 120° C. Said heating may be applied to either or both the imaging element and the receptor element before, while or after bringing the receptor layer in contact with the thermo-adhesive layer of the imaging element.

When the imaging element comprises a pressure-adhesive layer or the receptor layer is coated or laminated with a pressure-adhesive layer, said laminating requires a pressure step. Said pressure is applied while the pressure-adhesive layer is in contact with the thermo-adhesive layer of the imaging element.

An imaging element and a receptor element may be brought in contact before exposure. In such embodiment it is required that either the back of the imaging element and/or preferably the receptor element is transparent for the radiation used for the exposure of the heat sensitive hydrophobic composition.

Because the imaging element according to the present invention comprises a hydrophobic heat sensitive composition contiguous to a hydrophilic surface of a support, the obtained image can be used as a lithographic printing plate. Pattern-wise transfer of the hydrophobic heat sensitive composition to a receptor material will then result in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink. The areas which accept ink form the printing image areas and the ink-rejecting areas form the background areas.

Said lithographic printing plate can further be cleaned with water or an aqueous solution e.g. by wipping with a wet sponge, rinsing with a spray of unheated water or of an aqueous solution etc.

The following examples illustrate the present invention without limiting it thereto.

EXAMPLE 1

Preparation of a Carbon Black Dispersion CBD-I

A carbon black dispersion was prepared by dissolving 60 g of PLIOTONE 3015 (a trade name of GOODYEAR for a copolymer of vinyltoluene-butadiene) in 900 g of methylethylketone in a ball mill and by adding 40 g of CORAX L6 (a trade name of DEGUSSA for a carbon pigment) and 0.5 g of SOLSPERSE 24000GR (a trade name of ZENECA RESINS for a dispersing aid). After 72 hours of milling the dispersion was ready to use.

Preparation of the Hydrophilic Surface of the Support

To 440 g of a dispersion contg. 21.5% of $TiO_2$ (average particle size 0.3–0.5 μm) and 2.5% of polyvinylalcohol in deionized water w ere subsequently added, while stirring, 250 g of a 5% polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethylene terephthalate film support having a thickness of 175 μm (having provided thereon a hydrophilic subbing layer) at a wet coating thickness of 50 g/m2, dried at 30° C. and subsequently hardened by subjecting it to a temperature of 57° C. for 1 week.

Preparation of the Imaging Element

Onto the above obtained hydrophilic surface of a support, further on called lithographic base was coated a heat sensitive composition prepared by adding 5 g of a 10% solution of di-trimethylolpropane in methylethylketone to 95 g of the carbon black dispersion CBD-I. The mixture was coated to a wet coating thickness of 20 μm.

The above obtained imaging element was overcoated with a solution consisting of 20% aqueous dispersion of Baystal P2000 (from BAYER A.G., Germany) which is a copolymer containing styrene, butadiene and acrylic acid with a glass transition temperature of 34° C. (measured with the "1090 Thermolyzer" of Dupont Co.), a melt viscosity of more than 13420 Poise and an elasticity corresponding to a tg $\delta^{-1}$ value of 3.54 both last properties measured at 120° C. (with a "Viscoelastic melt tester" of Rheometrics Co, Surrey, UK.), to a wet coating thickness of 30 g/$m^2$.

The imaging element was exposed with a NDYLF-laser at a speed of 8.8 m/s.

The output power was varied from 0.29 W to 0.80 W. The spot size of the laser beam at 1/$e^2$ yielded 14.9 $\mu$m. Single scan lines were imaged.

The exposed imaging element was then placed in face-to-face contact with the receptor element, being a subbed polyethylene therephthalate support (having an upper subbing layer containing gelatine and silica). The contacting elements were conveyed through a roll laminator device at 90° C. and at a speed of 0.3 m/min. and the elements were peeled apart whereby the non-exposed parts of the heat sensitive composition are removed and the exposed areas remain on the lithographic base, thus being a negative working system.

The obtained image on the lithographic base could be used to print on a conventional offset press using a commonly used ink and fountain. Good copies were obtained.

EXAMPLE 2

An imaging element was prepared similar to the imaging element of example 1 with the exception that the heat sensitive composition was coated from a mixture prepared by adding 2.5 g of a 10% solution of AIBN (2,2'-azobisisobutyronitrile from AKZO) in methylethylketone and 2.5 g of a 10% solution of SARTOMER 399 (dipentaerythritolpentaacrylate from CRAY VALLEY) in methylethylketone to 95 g of the carbon black dispersion CBD-I. The mixture was coated to a wet coating thickness of 20 $\mu$m.

The imaging element was exposed and then laminated under similar conditions as used for example 1.

After peeling apart the exposed and laminated elements, the non-exposed parts of the heat sensitive composition are removed and the exposed areas remain on the lithographic base, thus being a negative working system. A good image was obtained.

The obtained image on the lithographic base could be used to print on a conventional offset press using a commonly used ink and fountain. Good copies were obtained.

EXAMPLE 3

An imaging element was prepared similar to the imaging element of example 1 with the exception that the heat sensitive composition was coated from a mixture prepared by adding 3.0 g of a 10% solution of di-trimethylolpropane in methylethylketone, 0.5 g of DEGACURE KI85 (a triphenylsulfonium salt from DEGUSSA) and 3.0 g of a 10% solution of CYMEL 301 (melamine resin from DYNO CYANAMID) in methylethylketone to 92.5 g of the carbon black dispersion CBD-I. The mixture was coated to a wet coating thickness of 20 $\mu$m.

The imaging element was exposed and then laminated under similar conditions as used for example 1.

After peeling apart the exposed and laminated elements, the non-exposed parts of the heat sensitive composition are removed and the exposed areas remain on the lithographic base, thus being a negative working system. A good image was obtained.

The obtained image on the lithographic base could be used to print on a conventional offset press using a commonly used ink and fountain. Good copies were obtained.

EXAMPLE 4

On a grained, anodized and sealed aluminum foil having a thickness of 150 $\mu$m, was coated a heat sensitive composition prepared by adding 5 g of a 10% solution of AIBN (2,2'-azobisisobutyronitrile from AKZO) in methylethylketone, and 10 g of a 10% solution of SARTOMER 399 (dipentaerythritolpentaacrylate from CRAY VALLEY) in methylethylketone to 85 g of the carbon black dispersion CBD-I. The mixture was coated to a wet coating thickness of 20 $\mu$m.

The above obtained imaging element was overcoated with a solution consisting of 20% aqueous dispersion of Baystal P2000 (from BAYER A.G., Germany) which is a copolymer containing styrene, butadiene and acrylic acid with a glass transition temperature of 34° C. (measured with the "1090 Thermolyzer" of Dupont Co.), a melt viscosity of more than 13420 Poise and an elasticity corresponding to a tg $\delta^{-1}$ value of 3.54 both last properties measured at 120° C. (with a "Viscoelastic melt tester" of Rheometrics Co, Surrey, UK.), to a wet coating thickness of 30 g/$m^2$.

The imaging element was exposed with a NDYLF-laser at a speed of 8.8 m/s.

The output power was varied from 0.29 W to 0.80 W. The spot size of the laser beam at 1/$e^2$ yielded 14.9 $\mu$m. Single scan lines were imaged.

The exposed imaging element was then placed in face-to-face contact with the receptor element, being a subbed polyethylene therephthalate support (having an upper subbing layer containing gelatine and silica). The contacting elements were conveyed through a roll laminator device at 90° C. and at a speed of 0.3 m/min. and the elements were peeled apart whereby the non-exposed parts of the heat sensitive composition are removed and the exposed areas remain on the lithographic base, thus being a negative working system.

The obtained image on the lithographic base could be used to print on a conventional offset press using a commonly used ink and fountain. Good copies were obtained.

EXAMPLE 5

On a grained, anodized and sealed aluminum foil having a thickness of 150 $\mu$m, was coated a heat sensitive composition prepared by adding 5g of a 10% solution of AIBN (2,2'-azobisisobutyronitrile from AKZO) in methylethylketone, and 10 g of a 10% solution of SARTOMER 399 (dipentaerythritolpentaacrylate from CRAY VALLEY) in methylethylketone to 85 g of the carbon black dispersion CBD-I. The mixture was coated to a wet coating thickness of 20 $\mu$m.

The above obtained imaging element was overcoated with a solution consisting of 20% aqueous dispersion of Baystal P2000 (from BAYER A.G., Germany) which is a copolymer containing styrene, butadiene and acrylic acid with a glass transition temperature of 34° C. (measured with the "1090 Thermolyzer" of Dupont Co.), a melt viscosity of more than 13420 Poise and an elasticity corresponding to a tg $\delta^{-1}$ value of 3.54 both last properties measured at 120° C. (with a "Viscoelastic melt tester" of Rheometrics Co, Surrey, UK.), to a wet coating thickness of 30 g/$m^2$.

The imaging element was exposed with a NDYAG-laser at a speed of 100 m/s. The output power was varied from 0.6 W to 6.2 W. The spot size of the laser beam at 1/$e^2$ yielded 13.8 um. Single scan lines were imaged.

The exposed imaging element was then placed in face-to-face contact with a pressure sensitive adhesive coated on a receptor layer(PERMAGARD PG7034 from MACTAC EUROPE S.A.). The contacting elements were conveyed through a roll laminator device at room temperature and at a speed of 0.3 m/min. and the elements were peeled apart whereby the non-exposed parts of the heat sensitive layer are removed and the exposed areas remain on the lithographic base, thus being a negative working system.

The obtained image on the lithographic base could be use to print on a conventional offset press using a commonly employed ink and fountain. Excellent copies were obtained.

We claim:

1. A heat sensitive imaging element comprising a support having a hydrophilic surface contiguous to said hydrophilic surface on said support a hydrophobic heat sensitive composition comprising a hydrophobic polymer binder, a compound capable of converting light into heat, and a reactive compound or mixture of reactive compounds present in an amount which surpasses the absorptive capacity of the hydrophobic polymer binder for said compound or mixture of compounds, said reactive compound or mixture of compounds being reactive under the influence of heat or under the influence of a reagent which is obtained by decomposition of a heat sensitive compound to harden said reactive compound or mixture of compounds and one or more thermo-adhesive layers, at least one of said thermo-adhesive layers being contiguous to said hydrophobic heat sensitive composition.

2. A heat sensitive imaging element according to claim 1 wherein said thermo-adhesive layer being contiguous to the hydrophobic heat sensitive composition has a glass transition temperature $T_g$ between 20° C. and 45° C., a melt viscosity greater than 7000 Poise and an elasticity corresponding to a $(tg\ \delta)^{-1}$ value greater than 1.30, both last properties measured at 120° C.

3. A heat sensitive imaging element according to claim 1 wherein said thermo-adhesive layer is covered by a receptor layer which is capable of adhering to said thermo-adhesive layer.

4. A heat sensitive imaging element according to claim 1 wherein said thermo-adhesive layer is covered by at least one pressure-adhesive layer.

5. A heat sensitive imaging element according to claim 4 wherein said pressure-adhesive layer is covered by a receptor layer.

6. A heat sensitive imaging element according to claim 5 wherein the thickness of said thermo-adhesive layer or said pressure-adhesive layer lies between 0.1 and 50 μm.

7. A heat sensitive imaging element according to claim 3 wherein said receptor layer is a transparent organic resin.

8. A heat sensitive imaging element according to claim 1 wherein said reactive compound or mixture of compounds is one which is capable of reacting under the influence of a reagent obtained by decomposition of a heat sensitive compound present in said heat sensitive composition.

9. A heat sensitive imaging element according to claim 1 wherein said hydrophilic surface of a support is a grained and anodized aluminum support.

10. A heat sensitive imaging element according to claim 1 wherein said hydrophilic surface of a support is a layer of polyvinyl alcohol hardened with a tetraalkyl orthosilicate wherein the weight ratio between said polyvinylalcohol and said tetraalkyl orthosilicate is between 0.5 and 5.

11. A method for obtaining a lithographic printing plate comprising the steps of:

(a) image-wise or information-wise exposing an imaging element according to claim 1

(b) developing said exposed imaging element, said development comprising in the order given the steps of:

i) laminating before or after said exposure the thermo-adhesive layer to a receptor layer and (ii) peeling away the receptor layer from the hydrophilic surface of the support thus transferring said hydrophobic photosensitive composition patternwise to the receptor layer.

12. The method according to claim 11 wherein said imaging element is made according to claim 4.

13. The method according to claim 11 wherein said imaging element is made according to claim 5.

14. The method according to claim 11 wherein said imaging element is made according to claim 6.

* * * * *